United States Patent
Strobel

(10) Patent No.: US 10,924,259 B2
(45) Date of Patent: Feb. 16, 2021

(54) METHOD AND APPARATUS FOR BINARY SIGNAL RECEPTION, CLOCK DATA RECOVERY, AND SOFT DECODING

(71) Applicant: MaxLinear, Inc., Carlsbad, CA (US)

(72) Inventor: Rainer Strobel, Munich (DE)

(73) Assignee: MaxLinear, Inc., Carlsbad, CA (US)

( * ) Notice: Subject to any disclaimer, the term of this patent is extended or adjusted under 35 U.S.C. 154(b) by 0 days.

(21) Appl. No.: 16/455,833

(22) Filed: Jun. 28, 2019

(65) Prior Publication Data
US 2020/0136793 A1 Apr. 30, 2020

(30) Foreign Application Priority Data
Oct. 31, 2018 (EP) .................................... 18203848

(51) Int. Cl.
| H04L 7/00 | (2006.01) |
| H03M 13/11 | (2006.01) |
| H04B 10/27 | (2013.01) |
| H04L 1/00 | (2006.01) |
| H04L 7/04 | (2006.01) |

(52) U.S. Cl.
CPC ....... *H04L 7/0075* (2013.01); *H03M 13/1108* (2013.01); *H03M 13/1111* (2013.01); *H04B 10/27* (2013.01); *H04L 1/0061* (2013.01); *H04L 7/0016* (2013.01); *H04L 7/04* (2013.01)

(58) Field of Classification Search
CPC ... H04L 7/0075; H04L 1/0061; H04L 7/0016; H04L 7/04; H03M 13/1108; H03M 13/1111; H04B 10/27
See application file for complete search history.

(56) References Cited

U.S. PATENT DOCUMENTS

| 7,593,490 B2* | 9/2009 | Alagha | H04B 7/18523 375/295 |
| 8,036,289 B2* | 10/2011 | Ryoo | H04L 27/266 370/203 |
| 2003/0223507 A1* | 12/2003 | De Gaudenzi | H04L 27/3411 375/279 |

(Continued)

OTHER PUBLICATIONS

"High Throughput LDPC Decoder for C-RAN Optical Fronthaul Based on Improved Bit-Flipping Algorithm", Ao Li, Vahid meghdadi, Jean-Pierre Ganges and Christelle Aupetit-Berthelemot, 2016 IOth International Symposium on Communication Systems, Networks and Digital Signal Processing (CSNDSP).

*Primary Examiner* — Mina M Shalaby
(74) *Attorney, Agent, or Firm* — Maschoff Brennan

(57) ABSTRACT

An apparatus for receiving a signal. The apparatus may include a demodulator configured to generate a binary signal from a received signal, a clock data recovery (CDR) circuitry configured to detect a phase error of the binary signal and generate CDR state information for the binary signal, a soft information generation circuitry configured to map the CDR state information to soft information for the binary signal, and a decoder configured to decode the binary signal using the soft information. The CDR circuitry may generate the CDR state information from multiple consecutive samples of the binary signal at least twice a symbol rate of the received signal. The soft information may be a log likelihood ratio of the binary signal, and the soft information generation circuitry may determine the log likelihood ratio based on an input bit error rate of the binary signal.

15 Claims, 10 Drawing Sheets

(56) References Cited

U.S. PATENT DOCUMENTS

| | | | |
|---|---|---|---|
| 2014/0016947 A1* | 1/2014 | Leven | H04B 10/6165 398/208 |
| 2014/0195878 A1* | 7/2014 | Razzetti | H04B 10/6165 714/776 |
| 2014/0247514 A1* | 9/2014 | Xiao | G11B 20/10046 360/45 |
| 2015/0236726 A1* | 8/2015 | Sankaranarayanan | H03M 13/1111 714/780 |
| 2016/0179620 A1* | 6/2016 | Bazarsky | H03M 13/3707 714/766 |
| 2017/0117925 A1* | 4/2017 | Achtenberg | G06F 11/1072 |
| 2017/0317759 A1* | 11/2017 | Agazzi | H04L 7/0075 |
| 2018/0097582 A1* | 4/2018 | Buchali | H04B 10/29 |
| 2020/0036393 A1* | 1/2020 | Ha | H03M 13/1575 |

* cited by examiner

METHOD AND APPARATUS FOR BINARY SIGNAL RECEPTION, CLOCK DATA RECOVERY, AND SOFT DECODING

FIELD

Examples relate to a communication system, more particularly a method and apparatus for binary signal reception, clock data recovery, and soft decoding.

BACKGROUND

A passive optical network (PON) is a network used to provide fiber-optic services to the end users. A PON implements a point-to-multipoint architecture, in which fiber optic splitters are used to enable a single optical fiber to serve multiple end-points. A PON does not have to provision individual fibers between the hub and the end users. A PON is often referred to as the "last mile" between an Internet service provider (ISP) and the end user.

BRIEF DESCRIPTION OF THE FIGURES

Some examples of apparatuses and/or methods will be described in the following by way of example only, and with reference to the accompanying figures, in which.

DETAILED DESCRIPTION

Various examples will now be described more fully with reference to the accompanying drawings in which some examples are illustrated. In the figures, the thicknesses of lines, layers and/or regions may be exaggerated for clarity.

Accordingly, while further examples are capable of various modifications and alternative forms, some particular examples thereof are shown in the figures and will subsequently be described in detail. However, this detailed description does not limit further examples to the particular forms described. Further examples may cover all modifications, equivalents, and alternatives falling within the scope of the disclosure. Like numbers refer to like or similar elements throughout the description of the figures, which may be implemented identically or in modified form when compared to one another while providing for the same or a similar functionality.

It will be understood that when an element is referred to as being "connected" or "coupled" to another element, the elements may be directly connected or coupled or via one or more intervening elements. If two elements A and B are combined using an "or", this is to be understood to disclose all possible combinations, i.e. only A, only B as well as A and B. An alternative wording for the same combinations is "at least one of A and B". The same applies for combinations of more than 2 elements.

The terminology used herein for the purpose of describing particular examples is not intended to be limiting for further examples. Whenever a singular form such as "a," "an" and "the" is used and using only a single element is neither explicitly or implicitly defined as being mandatory, further examples may also use plural elements to implement the same functionality. Likewise, when a functionality is subsequently described as being implemented using multiple elements, further examples may implement the same functionality using a single element or processing entity. It will be further understood that the terms "comprises," "comprising," "includes" and/or "including," when used, specify the presence of the stated features, integers, steps, operations, processes, acts, elements and/or components, but do not preclude the presence or addition of one or more other features, integers, steps, operations, processes, acts, elements, components and/or any group thereof.

Unless otherwise defined, all terms (including technical and scientific terms) are used herein in their ordinary meaning of the art to which the examples belong.

Figure 1:
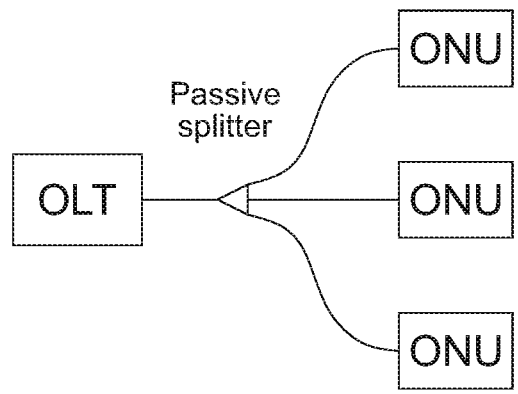
FIG. 1 shows an example PON.

FIG. 1 shows an example PON in which the examples disclosed herein may be implemented. A PON is a form of fiber-optic access network. A PON includes an optical line termination (OLT) at the service provider's central office and a number of optical network units (ONUs) near the end users. An OLT may serve multiple ONUs. The OLT and the ONUs are connected over a shared fiber and the signal is distributed with a passive optical splitter.

For increasing data rates in the PON, forward error correction (FEC) coding based on low density parity check (LDPC) codes is introduced. Improved error correction coding allows to increase data rates while keeping the same reach and power budget. For the optical access network, a transceiver design with low cost optical components is needed, such as a purely digital receiver without analog-to-digital conversion and non-coherent demodulation, based on an avalanche photo diode (APD) or a PIN diode.

LDPC codes may achieve higher performance if they are provided with soft information (soft bits) from the receiver. Hard information (hard-decision bits) represents each received bit with one bit. Soft information (soft bits/soft-decision bits) represents each received bit with two or more bits, e.g., log-likelihood ratio (LLR) values for the received bits. Conventionally, soft information is derived from the received signal amplitude, as it is provided from an analog-to-digital converter (ADC) in a receiver and requires knowledge of noise conditions. In case of a PON receiver, the input signal is recovered by an APD or a PIN diode and a limiting amplifier such that no amplitude information is available and the electrical receive signal is a binary signal.

Conventional PON systems rely on error correction codes (e.g. Reed-Solomon code) which do not benefit from soft information. Thus, soft information from the receiver is not needed. In the fiber core network, cost and power consumption limitations are less strict and coherent demodulation together with analog-to-digital conversion in the receiver are used to provide soft information for the LDPC decoder.

Examples are disclosed for providing methods to derive soft information from the digital input signal based on the digital clock data recovery circuit. The examples provide ways to derive soft information to be used as an input for the channel decoder (e.g. LDPC decoder) from a digital clock data recovery circuit such that no amplitude information and thus no analog-to-digital conversion is needed.

Examples are disclosed for a modified phase detector circuit providing soft information and methods to evaluate signal statistics and predict bit error statistics. Examples are also disclosed for low complexity LDPC decoder architectures to use the soft information.

The examples disclosed herein allow to provide soft information from a digital receive signal and thus benefit from the coding gain of the channel decoder while the energy efficient digital receiver architecture is used.

Hereafter, examples will be explained with reference to a transmitter and a receiver configured to operate in a PON network using an LDPC encoder/decoder. However, it should be noted that the examples are applicable to any transmitter and receiver configured to transmit and receive digital signals or binary signals and use any channel coding scheme that can utilize soft information.

Figure 2A:
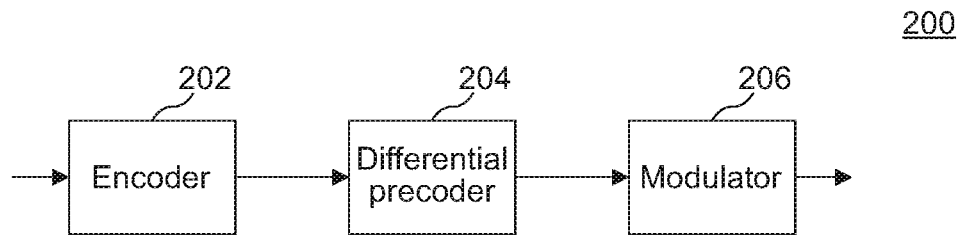
FIG. 2A is a block diagram of PON transmitter in accordance with one example.

FIG. 2A is a block diagram of PON transmitter in accordance with one example. In the transmitter 200, the input bit stream is encoded with an encoder 202 (e.g. LDPC encoder, Turbo coder, convolutional coder, or the like). A one-bit differential precoder 204 may optionally be used at the transmitter 200 to support electrical duobinary modulation. The encoded input bit stream is then modulated by the modulator 206. The modulation may be non-return-to-zero (NRZ) modulation or alternatively return-to-zero (RZ) modulation. The modulator 206 may be a part of a transmit optical sub-assembly (TOSA) that converts an electrical signal to an optical signal. The digital signal is represented in the optical domain by two different laser intensities.

Figure 2B:
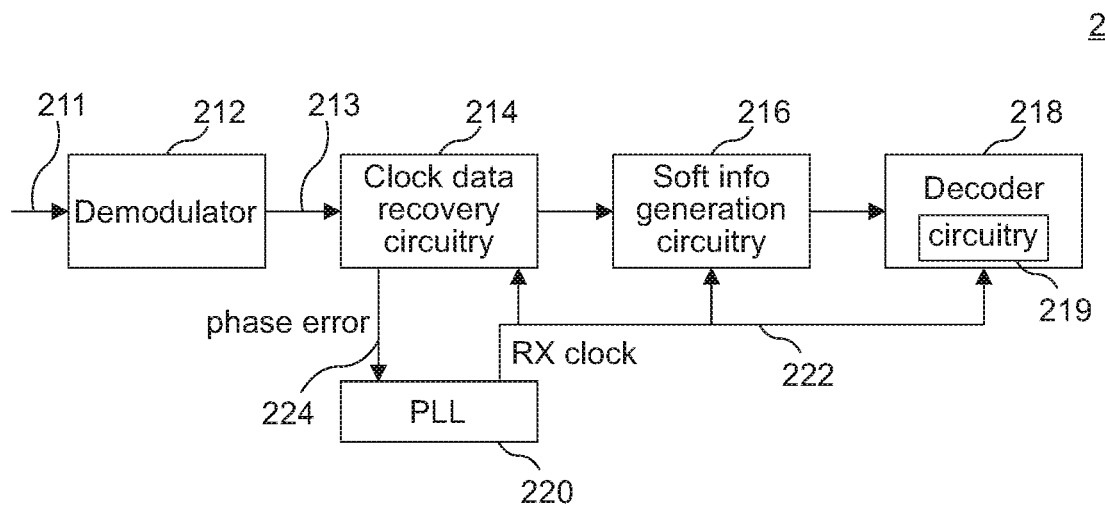
FIG. 2B is a block diagram of PON receiver in accordance with one example.

FIG. 2B is a block diagram of PON receiver in accordance with one example. In the receiver 210, the received signal 211 from the transmitter 200 is demodulated by the demodulator 212. The demodulator 212 may be an NRZ demodulator or alternatively an RZ demodulator. The demodulator 212 may be a part of a receive optical sub-assembly (ROSA) that converts an optical signal to an electrical signal. In case that differential precoding is applied at the transmitter 200, differential decoding is performed at the receiver 210.

The clock data recovery (CDR) circuitry 214 receives a binary signal 213 from the demodulator 212 and recovers the receive symbol clock and the digital bit stream for further processing. The CDR circuitry 214 outputs a phase error signal 224 to the PLL 200, and the PLL 200 adjusts the local oscillator signal (RX clock) based on the phase error signal 224. The soft information generation circuitry 216 generates or determines soft information (soft bits, e.g. LLR) for the binary signal 213 based on CDR states that is output from the CDR circuitry 214. As an example, generation of CDR states is shown in Tables 1 and 3 below, which will be explained in detail below. The soft information is then sent to the decoder 218 for error correction. The error corrected bits are then forwarded for further processing.

The decoder 218 may be any type of decoder that can utilize soft information (e.g. LDPC decoder, Turbo decoder, convolutional decoder, or the like). The decoder 218 (e.g. an LDPC decoder) includes a decoding circuitry 219 configured to receive soft information for a binary signal and decode the binary signal using the soft information. In case of an LDPC decoder, the decoding may use bit flipping, sum-product, and/or min-sum algorithm. In case of bit flipping algorithm, the circuitry 219 may be configured to use the soft information for bit flipping decision, which will be explained in detail below. The circuitry 219 may be configured to use a reliability bit associated to each check node that is initialized for high reliability and switched to low reliability in case that any of connected bit nodes is flipped.

Signal degradation may be caused by numerous reasons, e.g., by the laser diode at the transmitter, dispersion caused by the fiber as well as attenuation of the fiber and the optical splitters. At the receiver side receive noise may be added by the photo diode and the receive amplifier, etc. Furthermore, clock jitters of the transmitter and receiver clock sources degrade the signal. The LDPC-coded transmission may be used to achieve a very low output bit error rate. For example, the target for IEEE 802.3ca PON is to achieve less than $10^{-12}$ bit error rate (BER) at the LDPC decoder output with an input BER equal to or smaller than $10^{-2}$.

A limiting amplifier (not shown), which is part of the demodulator 212, generates a binary signal 213 y(t) $\lceil\{0,1\}$ from the photo diode output signal $\hat{x}(t)$, based on the detection threshold $x_{th}$ as follows:

$$y(t) = \begin{cases} 1 & \text{for } \hat{x}(t) > x_{th} \\ 0 & \text{for } \hat{x}(t) \leq x_{th} \end{cases}. \qquad \text{Equation (1)}$$

Figure 3:
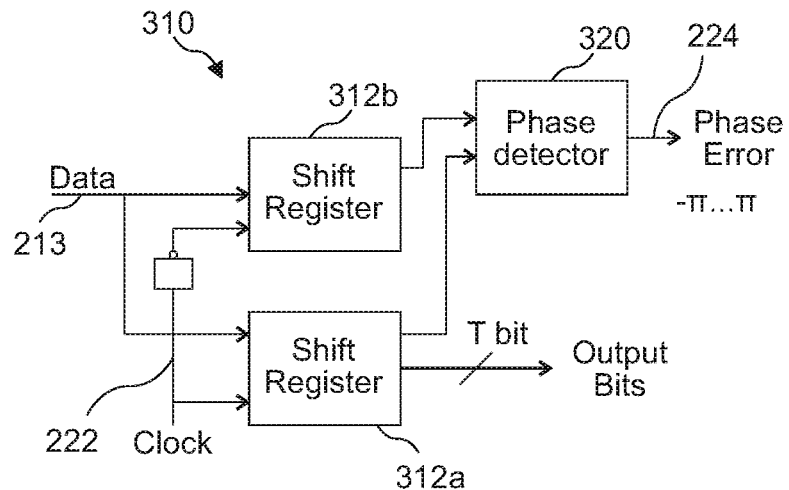
FIG. 3 shows an example clock data recovery (CDR) circuitry.

FIG. 3 shows an example CDR circuitry 214. The CDR circuitry 214 takes the binary signal 213 (i.e. an asynchronous digital input signal y(t)) and recovers the symbol clock. The CDR circuitry 214 includes a de-serializer 310 and a phase detector 320. The de-serializer 310 is configured to sample a binary signal at least twice a symbol rate of the binary signal. The phase detector 320 is configured to determine a phase error of the binary signal with respect to a local oscillator signal and generate CDR state information from samples of the binary signal. The phase detector 320 may be configured to generate the CDR state information from multiple (e.g. three or more) consecutive samples of the binary signal. Generation of example CDR state information will be explained in detail with reference to FIGS. 3 and 4 and Tables 1 and 2 below.

The de-serializer 310 may include multiple shift registers 312a, 312b. One shift register 312a is clocked by the RX clock 222 and the other shift register 312b is clocked by the inverse of the RX clock 222 so that the binary signal 213 may be sampled into the shift registers 312a, 312b at both rising and falling edges of the RX clock 222. The de-serializer 310 collects multiple serial samples of the binary signal 213 in the shift registers 312a, 312b and further processing may be performed for a block of data at a lower clock rate (serial-to-parallel conversion).

The phase detector 320 derives the phase information from the sampled signal to control the local oscillator. The oscillator control loop is maintained in the PLL 220, which provides the RX clock 222 for other processing units in the receiver 210. In examples, a digital phase detector is used, which may be based on the bang-bang phase detector concept, in combination with serial-to-parallel conversion of the input signal.

Inputs to the CDR circuitry 214 are the un-clocked (unsynchronized) receive signal y(t) (i.e. the binary signal 213) and the local oscillator signal (i.e. the RX clock 222). The outputs from the CDR circuitry 214 are the phase error signal 224 and the signal $y^{[t]}$ (re-timed input signal) at the sample rate.

Figure 4:
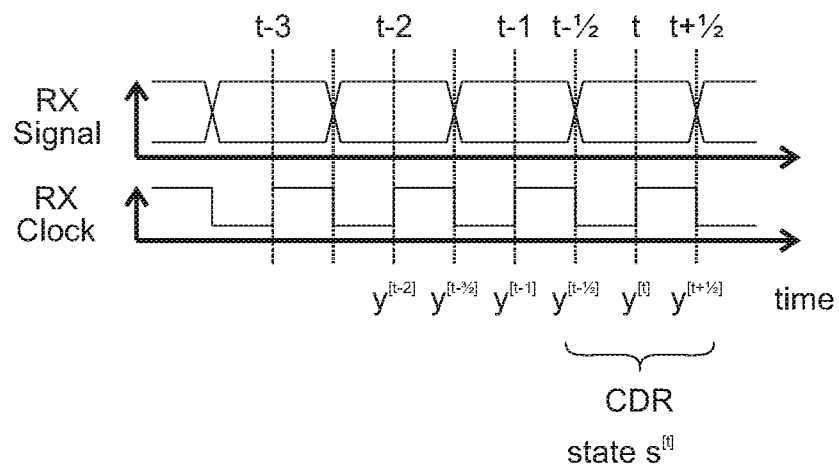
FIG. 4 shows sampling of the binary signal to derive the CDR states in accordance with one example.

FIG. 4 shows sampling of the binary signal 213 to derive the CDR states in accordance with one example. To obtain information about the phase error, the binary signal 213 may be sampled at the double sampling rate, e.g., at the rising and falling edge of the clock signal 222, as shown in FIG. 3. In one example, from three inputs $$y^{[t-\frac{1}{2}]}, y^{[t]}, \text{ and } y^{[t+\frac{1}{2}]},$$

(i.e. the signals y (the binary signal 213) sampled at time instances t−1/2, t, and t+1/2), the CDR state $s^{[t]}$=0, . . . , 7 may be derived. In this example, 8 CDR states are possible with the three sampled values. As an alternative, if more than three sampled values are used, the number of possible CDR states will increase. All possible CDR states $s^{[t]}$ for this example are shown in Table 1.

TABLE 1

| $s^{[t]}$ | $y^{[t-\frac{1}{2}]}$ | $y^{[t]}$ | $y^{[t+\frac{1}{2}]}$ | Description |
|---|---|---|---|---|
| 0 | 0 | 0 | 0 | No edge, low |
| 1 | 0 | 0 | 1 | Rising edge, late |
| 2 | 0 | 1 | 0 | Glitch, low |
| 3 | 0 | 1 | 1 | Rising edge, early |
| 4 | 1 | 0 | 0 | Falling edge, early |
| 5 | 1 | 0 | 1 | Glitch, high |
| 6 | 1 | 1 | 0 | Falling edge, late |
| 7 | 1 | 1 | 1 | No edge, high |

Each CDR state indicates a phase error. An early edge (states 3 and 4) gives a positive phase error for the PLL 220 and a late edge (states 1 and 6) gives a negative phase error for the PLL 220. For all other states, the phase error is zero. There are two states (states 0 and 7) where no signal edge occurs and there are two states (states 2 and 5) with two phase changes (abnormal (glitch) states) which do not provide a phase error information.

Alternatively, three inputs $$y^{[t-1]}, y^{[t-\frac{1}{2}]}, \text{ and } y^{[t]},$$

(i.e. the signals y (the binary signal 213) sampled at time instances t−1, t−1/2, and t) may be used as an input. The CDR state table for this case is shown in Table 2. Different timing instances and/or different number of samples may be used as alternatives.

TABLE 2

| $s^{[t]}$ | $y^{[t-1]}$ | $y^{[t-\frac{1}{2}]}$ | $y^{[t]}$ | Description |
|---|---|---|---|---|
| 0 | 0 | 0 | 0 | No edge, low |
| 1 | 0 | 0 | 1 | Rising edge, early |
| 2 | 0 | 1 | 0 | Glitch, low |
| 3 | 0 | 1 | 1 | Rising edge, late |
| 4 | 1 | 0 | 0 | Falling edge, late |
| 5 | 1 | 0 | 1 | Glitch, high |
| 6 | 1 | 1 | 0 | Falling edge, early |
| 7 | 1 | 1 | 1 | No edge, high |

In general, both cases above provide the same control information. The two illegal states, (states 2 and 5) indicate a low signal quality, and these states may be used to estimate the input bit error rate (BER), which will be explained in detail below.

The CDR circuitry 214 may determine the phase errors of a signal y over time by observing the signal y at multiple points in time and may calculate the statistics of the positive and negative phase errors from a block of input data and generate the phase error signal 224 ($\Delta_\varphi$) based on the statistics, e.g. as shown in Equation (2) below. With serial-to-parallel conversion, T phase detector states may be processed at once, which gives a phase error range of $\Delta\varphi$=−π, . . . , π in 2T+1 discrete levels as an input for the PLL 220 as follows:

$$\Delta_\varphi = \frac{\pi}{T} \sum_{t=1}^{T} \begin{cases} -1 & \text{for } s^{[t]} = 1, 6 \\ +1 & \text{for } s^{[t]} = 3, 4. \\ 0 & \text{otherwise} \end{cases} \quad \text{Equation (2)}$$

The phase error value ($\Delta_\varphi$) in Equation (2) is generated by summing the CDR state values (1, 0, −1 in this example) over time in radian. The PLL 220 may be implemented as a linear filter with proportional and integral parts, defined by the constants $K_p$ and $K_i$. $K_p$ and $K_i$ are weighting factors. The PLL 220 controls the local oscillator clock frequency $f=f_0+\Delta f$ by updating the frequency offset $\Delta f$ according to the following:

$$\Delta f^{[t]} = f_{tmp}^{[t]} + K_p \Delta_\varphi, \quad \text{Equation (3)}$$

with the integral part $f_{tmp}^{[t]}$ given by:

$$f_{tmp}^{[t]} = f_{tmp}^{[t-1]} + K_i \Delta_\varphi. \quad \text{Equation (4)}$$

Depending on the loop filter constants $K_p$ and $K_i$, the PLL bandwidth is selected to achieve a precise recovery of the transmit clock and adjust the jitter of the near-end and far-end clock sources.

LDPC codes are defined by the parity-check matrix $H \in \{0,1\}R_{ldpc} \times N_{ldpc}$ for an LDPC code of block size $N_{ldpc}$ bits with $K_{ldpc}=N_{ldpc}-R_{ldpc}$ bits. The encoder performs the operation x=Gu where $G \in \{0,1\}N_{ldpc} \times K_{ldpc}$ is the generator matrix satisfying HG=0 in $GF_2$, x is the output codeword, and u is the input word. At the receiver, soft information in the form of LLR $m_{ch}$ as follows is used.

$$m_{ch} = \log(p_{xy}(x=0,y)) - \log(p_{xy}(x=1,y)). \quad \text{Equation (5)}$$

For the binary symmetric channel, with bit flipping probability $p_{flip}$, the LLR is given by:

$$m_{ch} = (1-2y)(\log p_{flip} - \log(1-p_{flip})), \quad \text{Equation (6)}$$

and for the additive white Gaussian noise (AWGN) channel, it is given by:

$$m_{ch} = -\frac{2}{\sigma^2} y,  \quad \text{Equation (7)}$$

where $\rho^2$ is a noise variance and y is a unit power of the binary signal (e.g. binary phase shift keying (BPSK) signal).

Different algorithms may be used to decode the LDPC data bits, e.g., the sum-product algorithm and the min-sum algorithm which use the soft information for decoding. Furthermore, there are lower complexity algorithms such as the bit flipping method, which does not take advantage of the soft information.

Figure 5A:
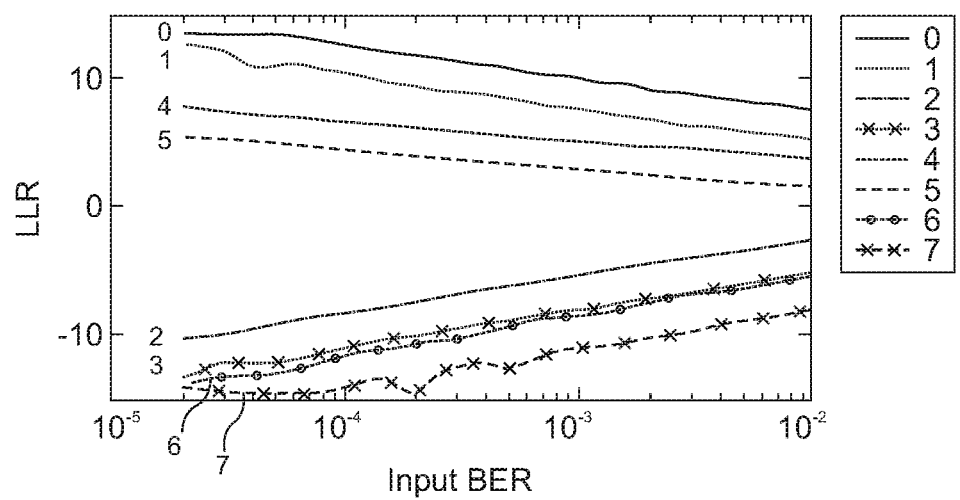
FIGS. 5A and 5B show the log likelihood ratios (LLRs) associated with the CDR states in accordance with some examples.
Figure 5B:
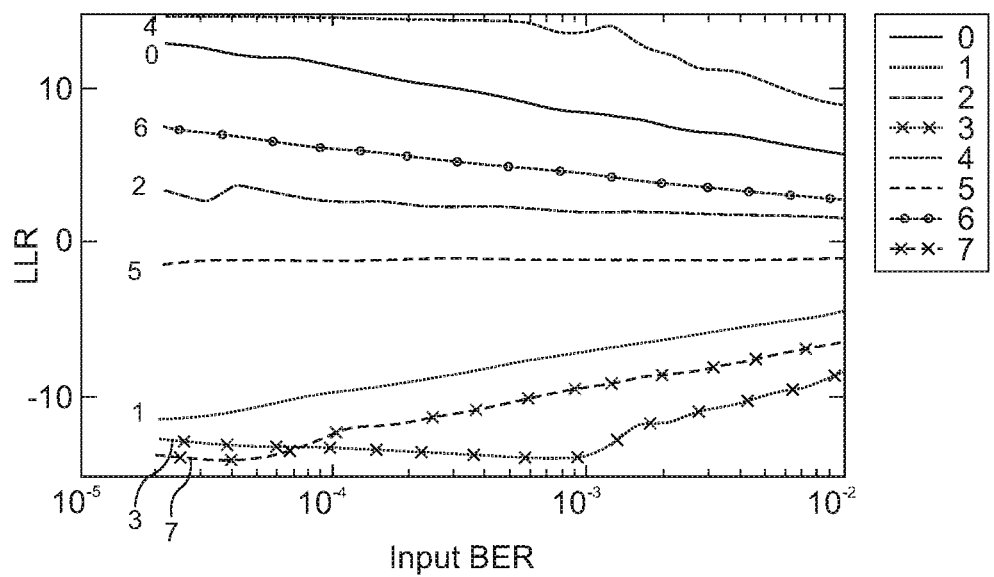

Usually, the LLR is derived from the signal amplitude according to Equation (7). With the binary receiver, the amplitude information is no longer available and the received signal is binary $y \in \{0,1\}$. However, for each bit, the phase detector 320 (e.g. a bang-bang phase detector, or the like) may provide additional information through the CDR state $s^{[t]}=0, \ldots, 7$. The LLR associated with each of the states is different. In one example, instead of deriving the LLR from the probability $p_{x,y}(x,y)$ as in Equation (5), the CDR state $s^{[t]}$ may be used to calculate the LLR. The soft information generation circuitry 216 may estimate the soft information associated to each of the CDR states by observing the bit error probabilities for each CDR state. The LLR may be calculated or determined as follows:

$$m_{ch} = \log(p_{xs}(x=0,s)) - \log(p_{xs}(x=1,s)) \quad \text{Equation (8)}$$

where $p_{xs}(x=0, s)$ and $p_{xs}(x=1, s)$ are conditional probabilities of x being 0 and 1, respectively, given the CDR state s. The LLR in Equation (8) requires knowledge of the individual probabilities $p(x=0, s)$ and $p(x=1, s)$ for each CDR state $s^{[t]}=0, \ldots, 7$. In one example, the LLR may be determined from the input BER. As an example, the LLR values associated with each CDR state obtained from simulation as a function of the input BER are shown in FIGS. 5A and 5B for the bang-bang phase detector operation. FIG. 5A shows the LLRs associated with the CDR states $s^{[t]}=0, \ldots, 7$ according to Table 1, and FIG. 5B shows the LLRs associated with the CDR states $s^{[t]}=0, \ldots, 7$ according to Table 2. After calculating the input BER, the LLR for each sample may be determined for each detected CDR state.

Figure 6A:
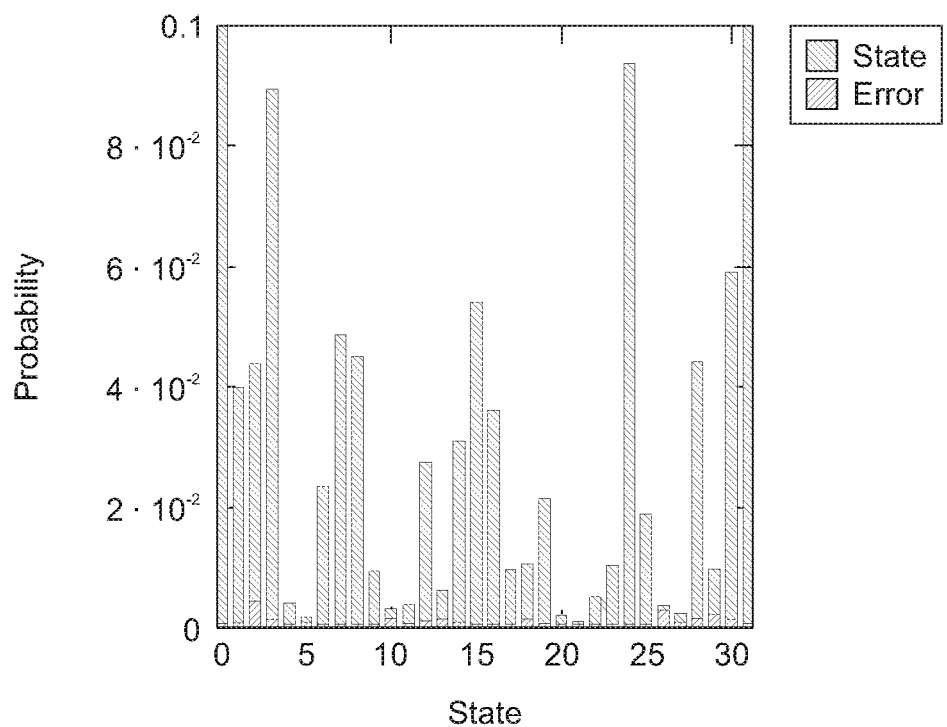
FIG. 6A shows the probability of occurrence for 32 CDR states as well as the probability of an error for each CDR state.
Figure 6B:
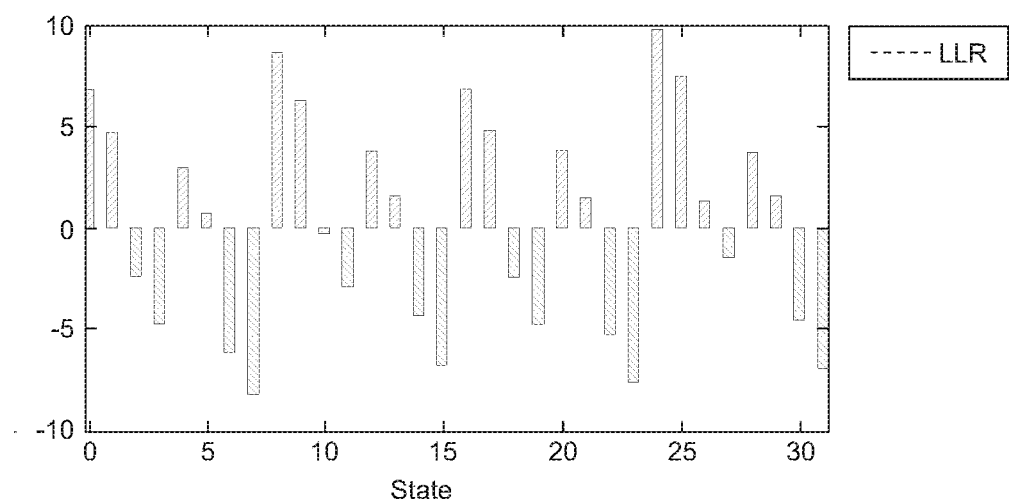
FIG. 6B shows the LLR associated with the 32 CDR states in FIG. 6A.

The quality of the LLR may be improved by using more memory. For example, the LLR may be derived from 5 consecutive input samples which $$y^{[t-\frac{3}{2}]}, y^{[t-1]}, y^{[t-\frac{1}{2}]}, y^{[t]}, \text{ and } y^{[t+\frac{1}{2}]},$$

which results in 32 different LLR values. The associated probabilities of these states as well as the error probabilities associated with each state are shown in FIGS. 6A and 6B. FIG. 6A shows the probability of occurrence for each of the 32 CDR states as well as the probability of an error for each CDR state. FIG. 6B shows the LLR associated with each of the 32 CDR states. Evaluating Equation (8) for the values in FIG. 6A gives the LLRs in FIG. 6B. FIGS. 6A and 6B show the probability of occurrence, probability of an error and the associated LLR for one specific BER (1e-2).

Figure 7A:
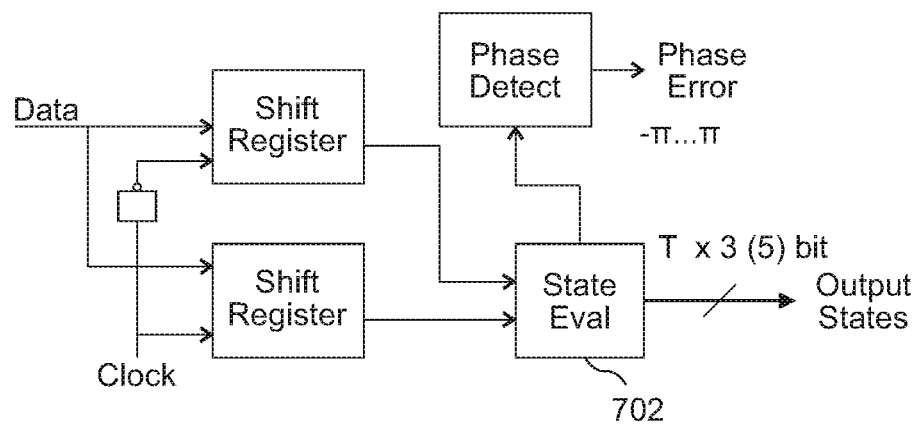
FIGS. 7A and 7B show example CDR circuitry implementations with additional output to be used for LLR calculation.
Figure 7B:
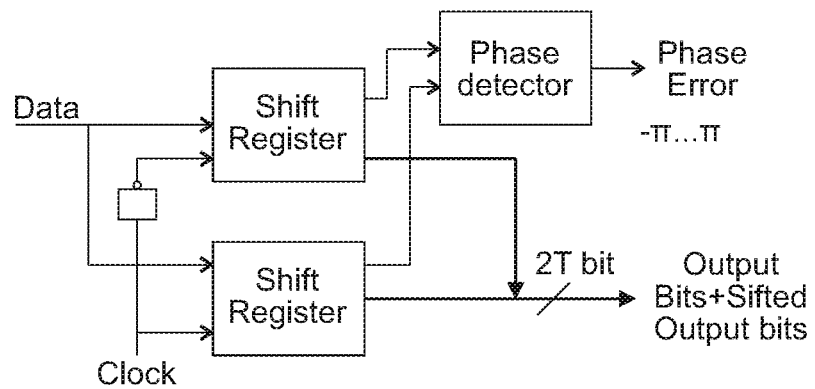

FIGS. 7A and 7B show example CDR circuitry 214 implementations with additional output to be used for LLR calculation. The CDR circuitry 214 may provide an additional output signal to be used for the LLR calculation or determination. In one example, as shown in FIG. 7A, the CDR circuitry 214 may include circuitry 702 for CDR state evaluation from the samples and output the CDR states (e.g., 3 or 5 bits per sample), which are also used for phase error calculation. Alternatively, as shown in FIG. 7B, the CDR circuitry 214 may provide the regular bits (e.g., sampled with the rising clock edge) as well as the shifted bits (e.g., sampled with the falling clock edge) as an output. From the regular and shifted output bits, the CDR states may be derived e.g. by the soft information generation circuitry 216.

As shown in FIGS. 5A and 5B, the LLR associated with each CDR state depends on the input BER. The input BER is not known in general. Example methods to derive the input BER and the LLR values associated with each CDR state are disclosed hereinafter.

Figure 8:
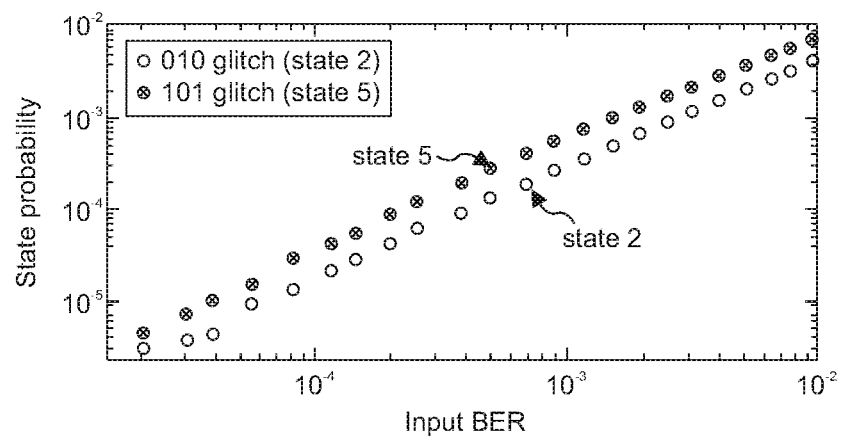
FIG. 8 shows dependency between the input bit error rate (BER) and the probability of occurrence of the CDR states 2 and 5.

The abnormal (glitch) states (i.e. the CDR states 2 and 5) in Tables 1 and 2 may be a good indication of the input BER since the occurrences of such abnormal states would lead to an increase of the input BER. FIG. 8 shows dependency between the input BER and the probability of occurrence of the CDR states 2 and 5 (glitch states). As shown in FIG. 8, the probabilities of CDR states 2 and 5 may not be equal. The difference may depend on the transmitter implementation (e.g., the probability of state 5 being higher than the probability of state 2 in FIG. 8 may be caused by the externally modulated laser). In both cases, the dependency between the glitch state probability and the input BER is described by a scalar value. Therefore, the receiver 210 (e.g. the soft information generation circuitry 216) may determine the statistics of the CDR state 2 or 5 (i.e. the probability of occurrence of the CDR states 2 or 5), and may determine the input BER based on the statistics of the CDR state 2 or 5.

Figure 9:
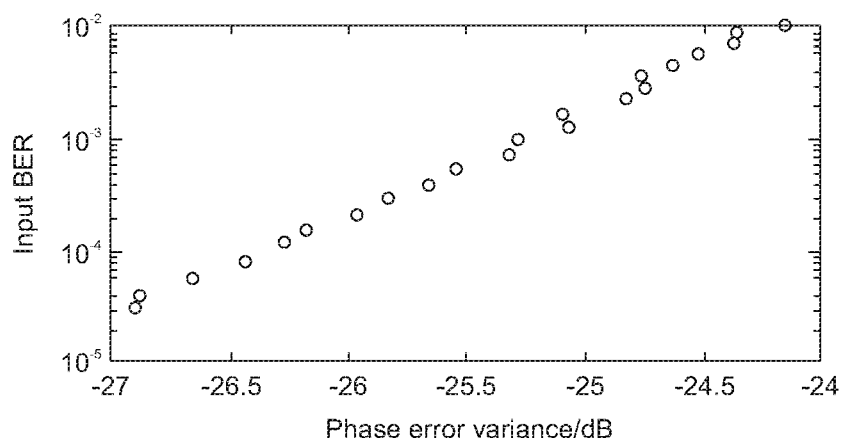
FIG. 9 shows the dependency between the input BER and the phase error variance.

Alternatively, the receiver 210 (e.g. the soft information generation circuitry 216) may determine the input BER based on the phase error variance. FIG. 9 shows the dependency between the input BER and the phase error variance. As shown in FIG. 9, the input bit error rate may be determined as a function of the measured phase error variance. In one example, the phase error variance is measured by the CDR circuitry 214 and from that value, the input BER may be estimated. With the known input BER, the LLR values for each CDR state can be determined from the dependency between the LLR and the input BER, as shown in FIGS. 5A and 5B.

Alternatively, the LLR values associated with the CDR states may be determined by training. In one example, in order to measure the LLR values associated with each of the CDR states, a training sequence may be transmitted by the transmitter 200 and the receiver 210 may calculate the LLR values associated with each CDR state based on the received training sequence. The training sequence is a known sequence to the receiver 210. The training sequence may be designed such that all possible CDR states may occur. For example, the training sequence may be a bit sequence $x_{train}$=[00110101] or any other sequence with consecutive ones and zeros as well as changing ones and zeros (e.g., a sync pattern [1111001010] defined in IEEE 802.3ca may be used for this purpose). This training sequence may be transmitted regularly at a known position in the bit stream. Based on the received training sequence (vector $y_{train}$) and the CDR state vector $s_{train}$, the conditional probabilities $p_{xs}(x,s)$ are measured by counting the occurrences of certain CDR states. The LLR values are derived from the measured conditional probability values according to Equation (8).

In another example, the LLR values for each CDR state may be determined by offline simulations of the system. The pre-determined LLR values may then be used as the soft information for an associated CDR state detected and may then be used for decoding the received data stream.

Figure 10:
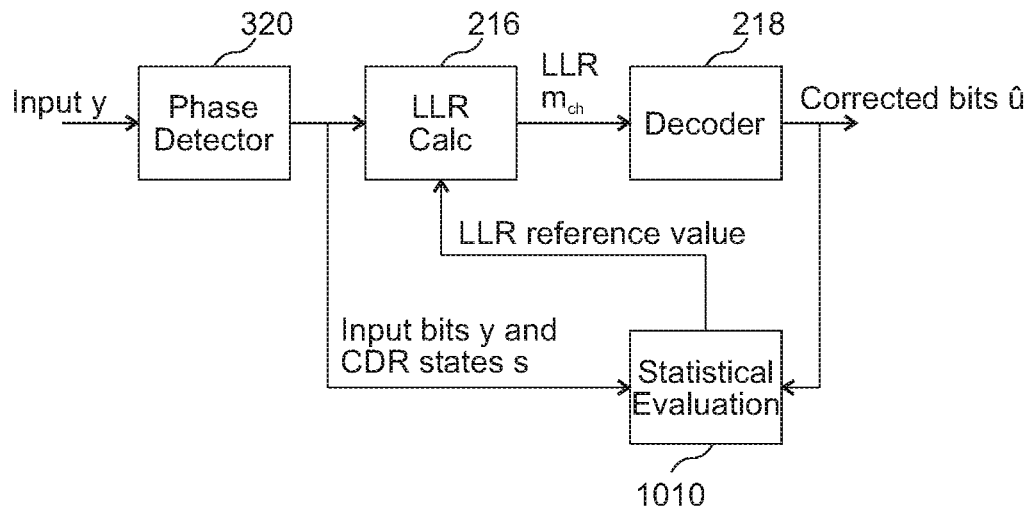
FIG. 10 shows an example receiver for blind LLR determination.

In another example, in case that a training sequence is not available, the LLR values may be determined blindly based on the input and output bit streams of the decoder 218. The initial LLR values may be assumed for each CDR state and the LLR values may be updated by comparing the input and output bit streams of the decoder 218. FIG. 10 shows an example receiver for blind LLR determination. The receiver 210 may include a statistical evaluation unit 1010 that receives the (retimed) input bits y along with the CDR states from the phase detector 320 and the decoded (corrected) bits û from the decoder 218, and calculates LLR values for each CDR state based on the input bits y and the decoded bits û. In this example, the decoder 218 needs to correct bit errors with a high probability. This example method may be used in combination with other methods to improve the initial LLR estimation.

The theoretical gain of the receiver architecture may be derived in terms of the channel capacity. The channel capacity may be derived from the conditional probabilities of the channel input (transmitted) bits x and the received bits y. In case of a binary (e.g. NRZ) channel, the inputs can take the states $x \in \{0,1\}$, while the output signal y may have more than two states or may even be continuous, as for the AWGN channel. The mutual information is given by:

$$I_{xy}(x, y) = \sum_x \sum_y p_{xy}(x, y) \log_2\left(\frac{p_{xy}(x, y)}{p_x(x) p_y(y)}\right) \quad \text{Equation (9)}$$

with the joint probability $p_{x,y}(x,y)$ of input x and output y, and the individual probability of the channel input $p_x(x)$ and the channel output $p_y(y)$. In case of a binary receiver, $y \in \{0,1\}$ holds. Assuming a binary symmetric channel (BSC) with bit flipping probability $p_{flip}$, the conditional probabilities are $p_{xy}(0,0)=p_{xy}(1,1)=(1-p_{flip})/2$, and $p_{xy}(0,1)=p_{xy}(1,0)=p_{flip}/2$. For the AWGN channel with noise variance $\rho^2$ and the receive signal probability density function is:

$$f_{xy}(x, y) = \begin{cases} \frac{1}{\sqrt{2\pi\sigma^2}} e^{-\frac{(y-1)^2}{2\sigma^2}} & \text{for } x = 1 \\ \frac{1}{\sqrt{2\pi\sigma^2}} e^{-\frac{(y+1)^2}{2\sigma^2}} & \text{for } x = 0 \end{cases} \quad \text{Equation (10)}$$

with the channel input bit x=1 associated with +1 and the input bit x=0 associated with −1.

$$I_{xy}(x, y) = \sum_x \int_{y=-\infty}^{\infty} f_{xy}(x, y) \log_2\left(\frac{f_{xy}(x, y)}{p_x(x) p_y(y)}\right). \quad \text{Equation (11)}$$

$f_y(y)$ is the probability density function of the receive signal y. The probabilities $p_y(y)$ is used in case that the receive signal y is discrete, e.g., a binary signal or a discrete set of LLR values and $f_y(y)$ is used in case of a receive signal that is continuous (in amplitude), e.g., the AWGN channel. With the receiver 210 using the CDR state information in accordance with examples disclosed herein, the mutual information may be derived from the conditional probability $p_{xs}(x,s)$ using Equation (9).

Figure 11:
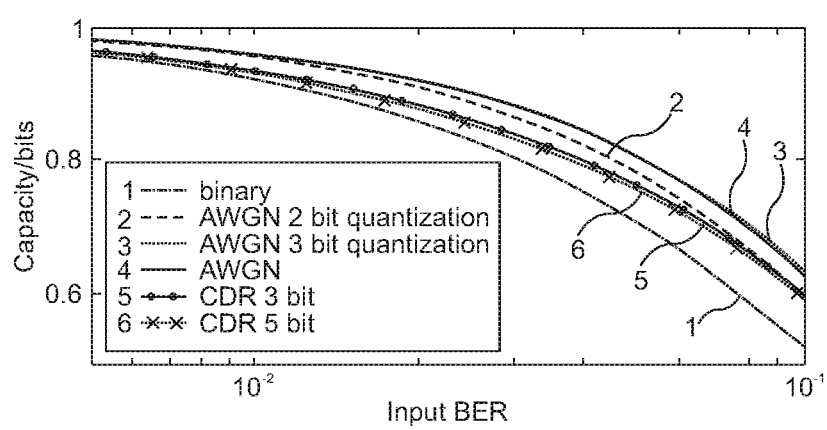
FIG. 11 shows channel capacity over an input bit error rate.
Figure 12:
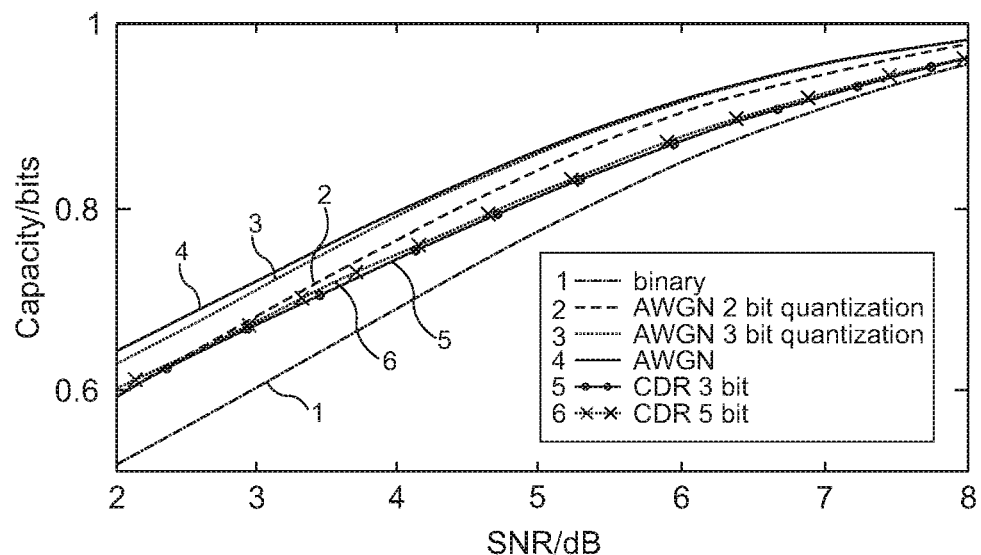
FIG. 12 shows channel capacity over additive white Gaussian noise (AWGN) signal-to-noise ratio (SNR)

FIGS. 11 and 12 show a capacity gain associated with the soft information derived from the CDR state information. FIG. 11 shows channel capacity over an input bit error rate. FIG. 11 shows a comparison among the BSC channel, the AWGN channel (AWGNs without quantization and with 2- and 3-bit quantization), and the AWGN channel with quantization at the receiver with the CDR receiver (3 and 5 bits) in accordance with examples disclosed herein. For capacities around 0.75 bit, the binary CDR receiver performance comes close to the 2-bit ADC receiver.

FIG. 12 shows channel capacity over AWGN signal-to-noise ratio (SNR). FIG. 12 shows a comparison among the BSC channel, the AWGN channel (AWGNs without quantization and with 2- and 3-bit quantization), and the AWGN channel with quantization at the receiver with the CDR receiver (3 and 5 bits) in accordance with examples disclosed herein. FIG. 12 shows that up to 1 dB gain over the standard binary receiver is achievable in terms of channel capacity.

Examples are disclosed below for benefiting from the CDR soft information in the LDPC decoder for different decoder architectures. The LDPC decoder may be a sum-product decoder, a min-sum decoder, or a bit-flipping decoder. The sum-product and the min-sum LDPC decoder may use the LLR obtained from the CDR state as disclosed above. The conventional bit flipping LDPC decoder needs some changes to benefit from the CDR state information (i.e. soft information).

Figure 13:
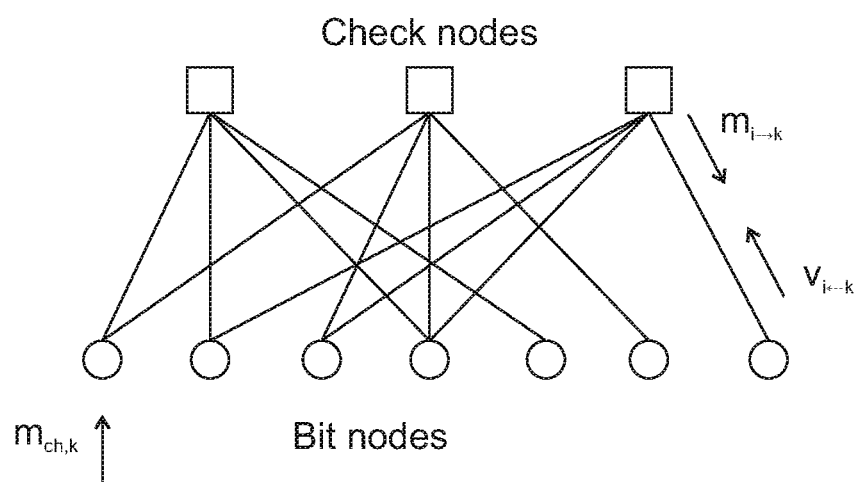
FIG. 13 shows a Tanner graph for low density parity check (LDPC) decoding.

The min-sum decoder and the sum-product decoder can use LLRs $m_{ch}$ as an input. LDPC decoding is performed iteratively by passing messages between $N_{ldpc}$ bit nodes and $R_{ldpc}$ check nodes. FIG. 13 shows a Tanner graph for LDPC decoding. The messages $m_{i \rightarrow k}$ are sent from check node i to bit node k. The messages $v_{i \leftarrow k}$ are sent from the bit node k to the check node i. All messages are initialized with $m_{ik}=0 \forall i,k$ and $v_{ik}=0 \forall i,k$.

In each iteration, the messages $v_{ik}$ are calculated as follows:

$$v_{i \leftarrow k} = m_{ch,k} + \Sigma_{l:H_{lk}=1, l \neq i} m_{l \rightarrow k}. \quad \text{Equation (12)}$$

The messages $m_{i \rightarrow k}$ for the sum-product algorithm are calculated as:

$$m_{i \rightarrow k} = 2\tanh^{-1}\left(\prod_{l:H_{il}=1, l \neq k} \tanh\left(\frac{1}{2} v_{i \leftarrow l}\right)\right). \quad \text{Equation (13)}$$

For the min-sum-algorithm, this is simplified to:

$$m_{i \rightarrow k} = \min_{l:H_{il}=1, l \neq k} |v_{i \leftarrow l}| \prod_{l:H_{il}=1, l \neq k} \text{sign}(v_{i \leftarrow l}). \quad \text{Equation (14)}$$

The final output LLR $m_{out,k}$ is given by:

$$m_{out,k} = m_{ch,k} + \Sigma_{l:H_{lk}=1} m_{l \rightarrow k}. \quad \text{Equation (15)}$$

The hard decision output bits $\hat{u}_k$ are as follows:

$$\hat{u}_k = \begin{cases} 0 & \text{for } m_{out,k} > 0 \\ 1 & \text{for } m_{out,k} \leq 0 \end{cases}. \quad \text{Equation (16)}$$

Both sum-product and min-sum algorithms can use the LLR given by Equation (8) as an input to the iterative decoding and thus, benefit from the CDR state-based soft information.

Figure 14:
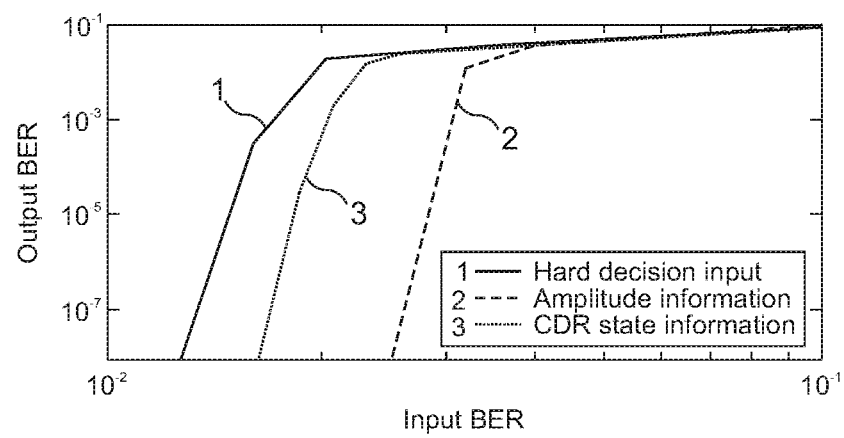
FIG. 14 show the output BER vs. input BER for different LDPC decoder input signals.

FIG. 14 show the output BER vs. input BER for different LDPC decoder input signals. FIG. 14 shows the performance advantage achieved by using the CDR state-based soft information as input to the sum-product decoder, compared to using hard decision inputs. Soft information derived from the receive amplitude achieves even lower output bit error rates, but it would require a more expensive receiver design with an ADC.

A bit flipping decoder is a lower complexity decoder having an advantage in terms of power consumption and hardware complexity. In contrast to the sum-product and min-sum algorithm, conventional bit flipping decoders use the hard decision bits $y^{[r]} \in \{0,1\}$ as input and thus, do not benefit from soft information.

Examples are provided for an improved bit flipping decoder which is able to benefit from the CDR state-based soft information. Instead of storing messages, the check node values $c_i$, $i=1, \ldots, R_{ldpc}$ and the bit node values $\hat{u}_k$, $k=1, \ldots, N_{ldpc}$ are stored. The bit node values are initialized with the channel inputs $y^{[r]}$. In each iteration, the check nodes are updated as follows:

$$c_i = \bigoplus_{l:H_{il}=1, i \neq l} \hat{u}_l, \quad \text{Equation (17)}$$

where is the exclusive OR operation.

The bit node decision is derived by collecting the messages for each bit node and decide to flip the node. For each bit, the number of check nodes indicating a zero $N_0$ and the number of check nodes indicating a one $N_1$ are counted as follows:

$$N_{0,k} = \Sigma_{l:H_{lk}=1} c_l, \text{ and} \quad \text{Equation (18)}$$

$$N_{1,k} = \Sigma_{l:H_{lk}=1}(1-c_l) \quad \text{Equation (19)}$$

To improve the algorithm, a confidence bit $r_i \in \{0,1\}$ may be assigned to each check node $c_i$, $i=1, \ldots, R_{ldpc}$ where $r=1$ indicates high confidence and $r=0$ indicates low confidence. The confidence bits are all initialized with $r=1$ and change to $r=0$ if any of the connected bit nodes flips. The confidence information is considered to weight the check nodes as follows:

$$N_{0,k} = \Sigma_{l:H_{lk}=1} c_l (1+r_l), \text{ and} \quad \text{Equation (20)}$$

$$N_{1,k} = \Sigma_{l:H_{lk}=1}(1-c_l)(1+r_l). \quad \text{Equation (21)}$$

Bits are flipped if the following conditions hold:

$$\hat{u}_k^{[r+1]} = \begin{cases} 0 & \text{for } \hat{u}_k^{[r]} = 1 \wedge N_{0,k} - N_{1,k} > N_{th} \\ 1 & \text{for } \hat{u}_k^{[r]} = 1 \wedge N_{1,k} - N_{0,k} > N_{th}, \\ \hat{u}_k^{[r]} & \text{otherwise} \end{cases} \quad \text{Equation (22)}$$

where the threshold $N_{th}$ is an integer threshold which is reduced through the iterations, depending on the maximum difference $|N_{1,k} - N_{0,k}|$ and the number of bits flipped per iteration.

To include soft information from the input, Equation (22) may be changed as follows:

$$\hat{u}_k^{[r+1]} = \begin{cases} 0 & \text{for } \hat{u}_k^{[r]} = 1 \wedge N_{0,k} + \lfloor \alpha m_{ch,k} \rfloor - N_{1,k} > N_{th} \\ 1 & \text{for } \hat{u}_k^{[r]} = 0 \wedge N_{1,k} - \lfloor \alpha m_{ch,k} \rfloor - N_{0,k} > N_{th}, \\ \hat{u}_k^{[r]} & \text{otherwise} \end{cases} \quad \text{Equation (23)}$$

where the scaled input LLR $\lfloor \alpha m_{ch,k} \rfloor$ with $\alpha$ scale factor $\alpha$ is part of the bit flipping decision. The bit flipping LDPC decoder may use scaled, rounded, or saturated soft information as input to the bit flipping decision. The scale factor $\alpha$ may be adjusted during the iterations to improve convergence.

Figure 15:
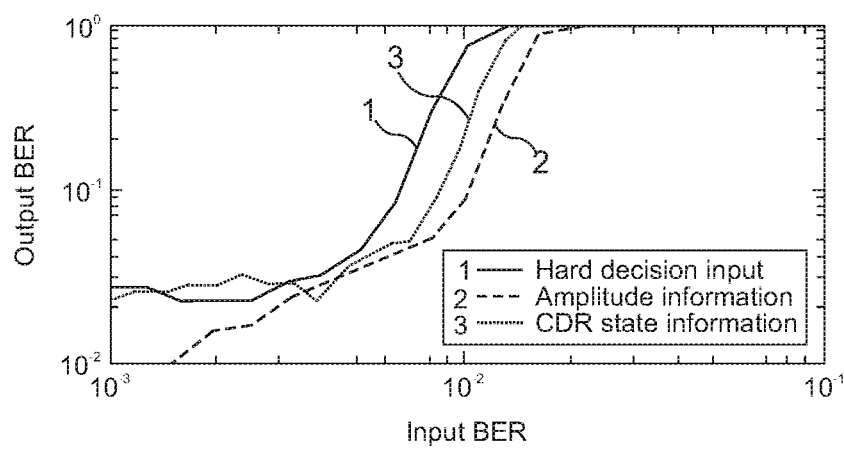
FIG. 15 shows the performance comparison for the bit flipping decoder using different LDPC decoder input signals.

FIG. 15 shows the performance comparison (output symbol error rate vs. input BER) for the bit flipping decoder using different LDPC decoder input signals. The bit flipping algorithm using soft information achieves a performance advantage over the conventional bit flipping algorithm with hard decision input. With soft information derived from the received signal amplitude, the improved bit flipping algorithm in accordance with the examples disclosed herein achieves even lower bit error rates.

FIG. 15 shows that the bit flipping algorithm may not be able to achieve the target bit error rate at the desired input bit error rate. However, the bit flipping algorithm still corrects a good percentage of codewords. Therefore, in some examples, the bit flipping decoder in accordance with the examples disclosed above may be used to correct the majority of codewords, while those codewords which cannot be corrected by the bit flipping decoder may be processed by the min-sum or sum-product decoder, which runs at a lower data rate, (i.e. two-stage decoding architecture).

Figure 16:
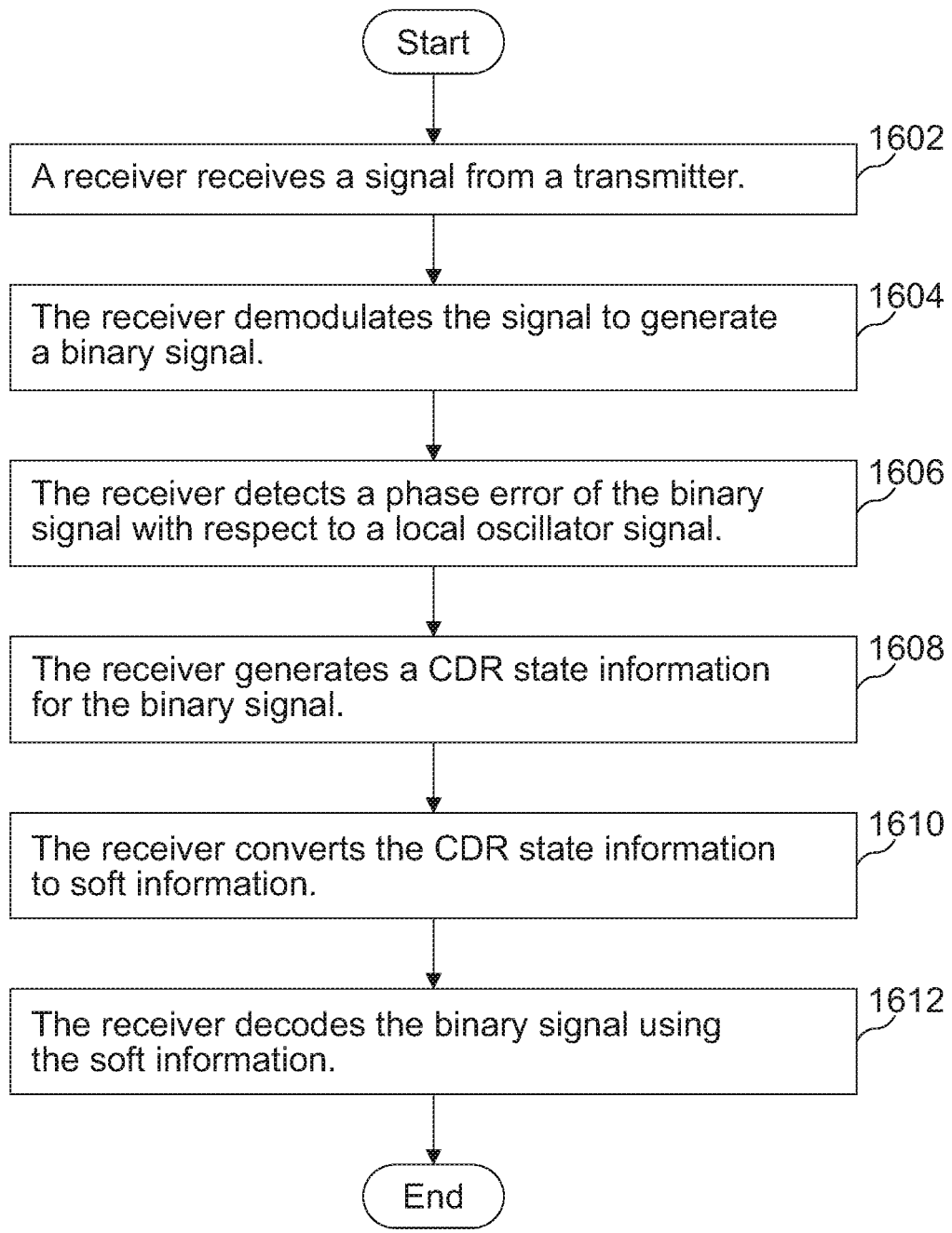
FIG. 16 is a flow diagram of an example process for receiving a binary signal.

FIG. 16 is a flow diagram of an example process for receiving a binary signal. A receiver receives a signal from a transmitter (1602). The receiver demodulates the signal to generate a binary signal (1604). The receiver detects a phase error of the binary signal with respect to a local oscillator signal (1606). The receiver generates CDR state information for the binary signal (1608). The receiver converts the CDR state information to soft information (1610). The receiver decodes the binary signal using the soft information (1612).

The soft information may be a log likelihood ratio of the binary signal, and the log likelihood ratio may be determined based on an input bit error rate of the binary signal. The input bit error rate may be determined based on statistics of glitch states or phase error variance of the binary signal. Alternatively, the log likelihood ratio associated with each CDR state may be determined based on a received training sequence or by comparing input bits for decoding and output bits from decoding.

Another example is a computer program having a program code for performing at least one of the methods described herein, when the computer program is executed on a computer, a processor, or a programmable hardware component. Another example is a machine-readable storage including machine readable instructions, when executed, to implement a method or realize an apparatus as described herein. A further example is a machine-readable medium including code, when executed, to cause a machine to perform any of the methods described herein.

The examples disclosed herein are applicable to not only PON devices but also any devices that are capable of using soft information for decoding using any coding schemes.

The examples as described herein may be summarized as follows:

Example 1 is an apparatus for receiving a signal. The apparatus may include a demodulator configured to generate a binary signal from a received signal, a CDR circuitry configured to detect a phase error of the binary signal with respect to a local oscillator signal and generate CDR state information for the binary signal, a soft information generation circuitry configured to convert the CDR state information to soft information for the binary signal, and a decoder configured to decode using the soft information.

Example 2 is the apparatus of example 1, wherein the CDR circuitry is configured to generate the CDR state information from three or more consecutive samples of the binary signal at least twice a symbol rate of the received signal.

Example 3 is the apparatus as in any one of examples 1-2, wherein the soft information is a log likelihood ratio of the binary signal, and the soft information generation circuitry is configured to determine the log likelihood ratio based on an input bit error rate of the binary signal.

Example 4 is the apparatus of example 3, wherein the soft information generation circuitry is configured to determine the input bit error rate based on statistics of glitch states or phase error variance of the binary signal.

Example 5 is the apparatus as in any one of examples 1-4, wherein the soft information is a log likelihood ratio of the binary signal, and the soft information generation circuitry is configured to determine a log likelihood ratio associated with each CDR state based on a received training sequence or by comparing input and output bits of the decoder.

Example 6 is the apparatus as in any one of example 1-5, wherein the decoder is an LDPC decoder implementing bit flipping algorithm and configured to use the soft information as input for bit flipping decision.

Example 7 is the apparatus of example 6, wherein the decoder is configured to use a reliability bit associated to each check node that is initialized for high reliability and switched to low reliability in case that any of connected bit nodes is flipped.

Example 8 is a circuitry for digital CDR from a binary signal. The circuitry may include a de-serializer configured to sample a binary signal at least twice a symbol rate of the binary signal, and a phase detector configured to determine a phase error of the binary signal with respect to a local oscillator signal and generate CDR state information from samples of the binary signal.

Example 9 is the circuitry of example 8, wherein the phase detector is configured to generate the CDR state information from three or more consecutive samples of the binary signal.

Example 10 is an LDPC decoder comprising a circuitry configured to receive soft information for a binary signal and decode the binary signal using bit flipping algorithm, wherein the soft information is used for bit flipping decision.

Example 11 is the LDPC decoder of example 10, wherein the circuitry is configured to use a reliability bit associated to each check node that is initialized for high reliability and switched to low reliability in case that any of connected bit nodes is flipped.

Example 12 is a method for receiving a signal. The method may include receiving a signal from a transmitter, demodulating the signal to generate a binary signal, detecting a phase error of the binary signal with respect to a local oscillator signal, generating CDR state information for the binary signal, converting the CDR state information to soft information, and decoding the binary signal using the soft information.

Example 13 is the method of example 12, wherein the soft information is a log likelihood ratio of the binary signal, and the log likelihood ratio is determined based on an input bit error rate of the binary signal.

Example 14 is the method of example 13, wherein the input bit error rate is determined based on statistics of glitch states or phase error variance of the binary signal.

Example 15 is the method as in any one of examples 12-14, wherein the soft information is a log likelihood ratio of the binary signal, and the log likelihood ratio associated with each CDR state is determined based on a received training sequence or by comparing input bits for decoding and output bits from decoding.

The aspects and features mentioned and described together with one or more of the previously detailed examples and figures, may as well be combined with one or more of the other examples in order to replace a like feature of the other example or in order to additionally introduce the feature to the other example.

Examples may further be or relate to a computer program having a program code for performing one or more of the above methods, when the computer program is executed on a computer or processor. Steps, operations or processes of various above-described methods may be performed by programmed computers or processors. Examples may also cover program storage devices such as digital data storage media, which are machine, processor or computer readable and encode machine-executable, processor-executable or computer-executable programs of instructions. The instructions perform or cause performing some or all of the acts of the above-described methods. The program storage devices may comprise or be, for instance, digital memories, magnetic storage media such as magnetic disks and magnetic tapes, hard drives, or optically readable digital data storage media. Further examples may also cover computers, processors or control units programmed to perform the acts of the above-described methods or (field) programmable logic arrays ((F)PLAs) or (field) programmable gate arrays ((F)PGAs), programmed to perform the acts of the above-described methods.

The description and drawings merely illustrate the principles of the disclosure. Furthermore, all examples recited herein are principally intended expressly to be only for pedagogical purposes to aid the reader in understanding the principles of the disclosure and the concepts contributed by the inventor(s) to furthering the art. All statements herein reciting principles, aspects, and examples of the disclosure, as well as specific examples thereof, are intended to encompass equivalents thereof.

A functional block denoted as "means for . . . " performing a certain function may refer to a circuit that is configured to perform a certain function. Hence, a "means for s.th." may be implemented as a "means configured to or suited for s.th.", such as a device or a circuit configured to or suited for the respective task.

Functions of various elements shown in the figures, including any functional blocks labeled as "means", "means for providing a sensor signal", "means for generating a transmit signal.", etc., may be implemented in the form of dedicated hardware, such as "a signal provider", "a signal processing unit", "a processor", "a controller", etc. as well as hardware capable of executing software in association with appropriate software. When provided by a processor, the functions may be provided by a single dedicated processor, by a single shared processor, or by a plurality of individual processors, some of which or all of which may be shared. However, the term "processor" or "controller" is by far not limited to hardware exclusively capable of executing software but may include digital signal processor (DSP) hardware, network processor, application specific integrated circuit (ASIC), field programmable gate array (FPGA), read only memory (ROM) for storing software, random access memory (RAM), and non-volatile storage. Other hardware, conventional and/or custom, may also be included.

A block diagram may, for instance, illustrate a high-level circuit diagram implementing the principles of the disclosure. Similarly, a flow chart, a flow diagram, a state transition diagram, a pseudo code, and the like may represent various processes, operations or steps, which may, for instance, be substantially represented in computer readable medium and so executed by a computer or processor, whether or not such computer or processor is explicitly shown. Methods disclosed in the specification or in the claims may be implemented by a device having means for performing each of the respective acts of these methods.

It is to be understood that the disclosure of multiple acts, processes, operations, steps or functions disclosed in the specification or claims may not be construed as to be within the specific order, unless explicitly or implicitly stated otherwise, for instance for technical reasons. Therefore, the disclosure of multiple acts or functions will not limit these to a particular order unless such acts or functions are not interchangeable for technical reasons. Furthermore, in some examples a single act, function, process, operation or step may include or may be broken into multiple sub-acts, -functions, -processes, -operations or -steps, respectively. Such sub acts may be included and part of the disclosure of this single act unless explicitly excluded.

Furthermore, the following claims are hereby incorporated into the detailed description, where each claim may stand on its own as a separate example. While each claim may stand on its own as a separate example, it is to be noted that—although a dependent claim may refer in the claims to a specific combination with one or more other claims—other examples may also include a combination of the dependent claim with the subject matter of each other dependent or independent claim. Such combinations are explicitly proposed herein unless it is stated that a specific combination is not intended. Furthermore, it is intended to include also features of a claim to any other independent claim even if this claim is not directly made dependent to the independent claim.

What is claimed is:

1. An apparatus for receiving a signal, comprising:
   a demodulator configured to generate a binary signal from a received signal;
   a clock data recovery (CDR) circuitry configured to sample the binary signal and detect a phase error of the binary signal with respect to a local oscillator signal in the apparatus and generate CDR state information for the binary signal, wherein the CDR circuitry is configured to generate the CDR state information from at least three consecutive samples of the binary signal sampled at least twice a symbol rate of the binary signal;
   a soft information generation circuitry configured to map the CDR state information to soft information for the binary signal; and
   a decoder configured to decode the binary signal using the soft information.

2. The apparatus of claim 1, wherein the soft information is a log likelihood ratio of the binary signal, and the soft information generation circuitry is configured to determine the log likelihood ratio based on an input bit error rate of the binary signal.

3. The apparatus of claim 2, wherein the soft information generation circuitry is configured to determine the input bit error rate based on statistics of glitch states or phase error variance of the binary signal.

4. The apparatus of claim 1, wherein the soft information is a log likelihood ratio of the binary signal, and the soft information generation circuitry is configured to determine a log likelihood ratio associated with each CDR state based on a received training sequence or by comparing input and output bits of the decoder.

5. The apparatus of claim 1, wherein the decoder is a low density parity check (LDPC) decoder implementing bit flipping algorithm and configured to use the soft information as input for bit flipping decision.

6. The apparatus of claim 5, wherein the decoder is configured to use a reliability bit associated to each check node that is initialized for high reliability and switched to low reliability in case that any of connected bit nodes is flipped.

7. A circuitry for digital clock data recovery (CDR) from a binary signal, comprising:
   a de-serializer configured to sample a binary signal at least twice a symbol rate of the binary signal; and
   a phase detector configured to determine a phase error of the binary signal with respect to a local oscillator signal and generate CDR state information from at least three consecutive samples of the binary signal.

8. The circuitry of claim 7, wherein the phase detector is configured to generate the CDR state information from multiple consecutive samples of the binary signal.

9. A low density parity check (LDPC) decoder, comprising:
   a decoding circuitry configured to receive soft information for a binary signal and decode the binary signal using bit flipping algorithm, wherein the soft information is used for bit flipping decision,
   wherein the decoding circuitry is configured to use a reliability bit associated to each check node that is initialized for high reliability and switched to low reliability in case that any of connected bit nodes is flipped.

10. A method for receiving a signal, comprising:
    receiving a signal from a transmitter;
    demodulating the received signal to generate a binary signal;
    sampling the binary signal to generate samples of the binary signal at least twice a symbol rate of the binary signal;
    detecting a phase error of the binary signal with respect to a local oscillator signal;
    generating clock data recovery (CDR) state information for the binary signal from at least three consecutive samples of the binary signal;
    mapping the CDR state information to soft information; and
    decoding the binary signal using the soft information.

11. The method of claim 10, wherein the soft information is a log likelihood ratio of the binary signal, and the log likelihood ratio is determined based on an input bit error rate of the binary signal.

12. The method of claim 11, wherein the input bit error rate is determined based on statistics of glitch states or phase error variance of the binary signal.

13. The method of claim 10, wherein the soft information is a log likelihood ratio of the binary signal, and the log likelihood ratio associated with each CDR state is determined based on a received training sequence or by comparing input bits for decoding and output bits from decoding.

14. The method of claim 10, wherein the binary signal is decoded by a low density parity check (LDPC) decoder implementing bit flipping algorithm and using the soft information as input for bit flipping decision.

15. The method of claim 14, wherein the LDPC decoder is configured to use a reliability bit associated to each check node that is initialized for high reliability and switched to low reliability in case that any of connected bit nodes is flipped.

\* \* \* \* \*